United States Patent
Davis

(10) Patent No.: US 8,688,954 B2
(45) Date of Patent: Apr. 1, 2014

(54) REMAPPING INOPERABLE MEMORY BLOCKS USING POINTERS

(75) Inventor: John D. Davis, San Francisco, CA (US)

(73) Assignee: Microsoft Corporation, Redmond, WA (US)

( * ) Notice: Subject to any disclaimer, the term of this patent is extended or adjusted under 35 U.S.C. 154(b) by 210 days.

(21) Appl. No.: 13/218,480

(22) Filed: Aug. 26, 2011

(65) Prior Publication Data

US 2013/0054936 A1 Feb. 28, 2013

(51) Int. Cl.

| G06F 12/02 | (2006.01) |
| G06F 13/00 | (2006.01) |
| G06F 12/16 | (2006.01) |
| G06F 9/26 | (2006.01) |
| G06F 9/34 | (2006.01) |

(52) U.S. Cl.
USPC ..... 711/209; 711/156; 711/165; 711/E12.103

(58) Field of Classification Search
USPC ............................ 711/209, 156, 165, E12.103
See application file for complete search history.

(56) References Cited

U.S. PATENT DOCUMENTS

| 7,352,621 B2* | 4/2008 | Rothman et al. ......... 365/185.09 |
| 7,869,269 B2 | 1/2011 | Donze et al. |
| 2007/0011581 A1 | 1/2007 | Nakanishi et al. |
| 2009/0282301 A1* | 11/2009 | Flynn et al. .................... 714/710 |
| 2009/0323417 A1* | 12/2009 | Takada ..................... 365/185.09 |
| 2010/0169602 A1 | 7/2010 | Hulbert et al. |
| 2010/0281202 A1* | 11/2010 | Abali et al. ................... 711/103 |
| 2011/0019491 A1 | 1/2011 | Kurjanowicz et al. |
| 2011/0119456 A1 | 5/2011 | Ipek et al. |

OTHER PUBLICATIONS

Seong, et al., "SAFER: Stuck-At-Fault Error Recovery for Memories" Retrieved at <<http://arch.ece.gatech.edu/pub/micro43.pdf>>, Proceedings of the 43rd Annual IEEE/ACM International Symposium on Microarchitecture, Dec. 4-8, 2010, pp. 115-124.

Ferreira et al., "Increasing PCM main memory lifetime", Retrieved at <<http://ieeexplore.ieee.org/stamp/stamp.jsp? tp=&arnumber=5456923>>, Design, Automation & Test in Europe Conference & Exhibition, Mar. 8-12, 2010, pp. 914-919.

Yoon, et al., "FREE-p: Protecting Non-Volatile Memory against both Hard and Soft Errors", Retrieved at <<http://lph.ece.utexas.edu/merez/uploads/MattanErez/freep_hpca11.pdf>>, The 17th IEEE International Symposium on High Performance Computer Architecture, Feb. 16, 2011, pp. 12.

(Continued)

*Primary Examiner* — Matthew Bradley
*Assistant Examiner* — Rocio Del Mar Perez-Velez
(74) *Attorney, Agent, or Firm* — Micah Goldsmith; Andrew Sanders; Micky Minhas

(57) ABSTRACT

Inoperable bits are determined in a memory block. Rather than abandon the block as inoperable, a data structure is generated that includes at least one memory page pointer that identifies the location of the inoperable bits in the memory block. The data structure is stored in one of a group of memory blocks that are reserved for the data structures. A pointer to the data structure is stored in metadata associated with the memory block with the inoperable bits. When a later memory operation is received for the memory block, the pointer is retrieved from the metadata and the memory page pointers are used to avoid the inoperable bits.

16 Claims, 7 Drawing Sheets

(56) References Cited

OTHER PUBLICATIONS

Ding, et al., "The enhancement of write throughout for phase change memory", Retrieved at <<http://ieeexplore.ieee.org/stamp/stamp.jsp?tp=&arnumber=5667569>>, 10th IEEE International Conference on Solid-State and Integrated Circuit Technology, Nov. 1-2, 2010, pp. 1121-1123.

"Remapping of Inoperable Memory Blocks", U.S. Appl. No. 12/915,025, filed Oct. 29, 2010, pp. 28.

* cited by examiner

REMAPPING INOPERABLE MEMORY BLOCKS USING POINTERS

BACKGROUND

Phase change memory ("PCM") is a potential replacement for dynamic random access memory in computers and other digital devices. Like other non-volatile memories, PCM has a limited lifetime or durability. Typically, one or more cells of the blocks of a PCM device may become inoperable and can no longer be reliably written to.

One solution is using error-correcting pointers ("ECPs"). However, ECPs are limited in the number of cell failures that can be corrected based on the total amount of memory available. Once this limit has been reached, subsequent cell failures may render an entire memory block unusable. Accordingly, the entire block may be discarded and any data in the block may have to be remapped. In the case where the PCM blocks are smaller than a virtual memory page, a single block failure may render an entire physical memory page unusable. When such errors occur during the runtime of an application, virtual page remapping may be needed for the application to continue executing, resulting in slower application performance, application crashes, or operating system crashes.

SUMMARY

Inoperable bits are determined in a memory block. Rather than abandon the entire block as inoperable, a data structure is generated that includes at least one memory page pointer that identifies the location of the inoperable bits in the memory block. The data structure is stored in one of a group of memory blocks that are reserved for the data structures. A pointer to the data structure is stored in metadata associated with the memory block with the inoperable bits. When a later memory operation is received for the memory block, the pointer is read from the metadata and used to retrieve the data structure. The memory page pointers from the data structure are used to avoid the inoperable bits.

In an implementation, an indication of one or more inoperable bits in a memory block is received by a memory controller. The memory block includes a plurality of bytes and each byte includes one or more bits. An address of a byte that includes the one or more inoperable bits is determined by the memory controller. A data structure that includes the address of the determined byte is generated by the memory controller. The data structure is associated with the memory block by the memory controller.

In an implementation, a memory operation is received for a memory block by a memory controller. The memory block is a mapped memory block and includes a plurality of bytes and at least one byte includes an inoperable bit. A data structure associated with the memory block is retrieved by the memory controller. One or more bytes of the bytes that do not include an inoperable bit are determined by the memory controller using the data structure. The memory operation is fulfilled using the determined one or more bytes by the memory controller.

In an implementation, an indication of one or more inoperable bits in a memory block of a plurality of memory blocks is received. An address of a byte that includes the one or more inoperable bits is determined. A data structure that includes the address of the determined byte is generated. A spare memory block is selected. The generated data structure is stored in the selected spare memory block. A pointer to the selected spare memory block is stored in metadata associated with the memory block with the indicated inoperable bit(s).

This summary is provided to introduce a selection of concepts in a simplified form that are further described below in the detailed description. This summary is not intended to identify key features or essential features of the claimed subject matter, nor is it intended to be used to limit the scope of the claimed subject matter.

BRIEF DESCRIPTION OF THE DRAWINGS

The foregoing summary, as well as the following detailed description of illustrative embodiments, is better understood when read in conjunction with the appended drawings. For the purpose of illustrating the embodiments, there is shown in the drawings example constructions of the embodiments; however, the embodiments are not limited to the specific methods and instrumentalities disclosed. In the drawings.

DETAILED DESCRIPTION

Figure 1:
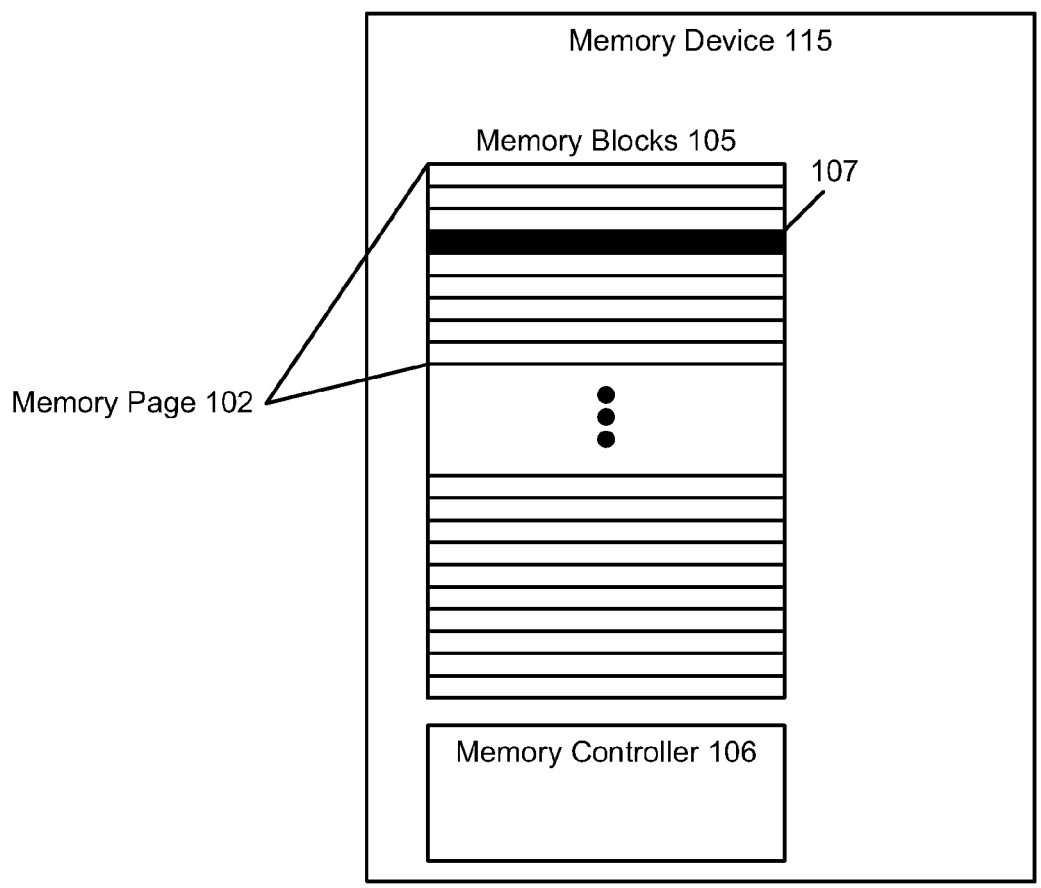
FIG. 1 is an illustration of an example memory page that is mapped to one or more memory blocks of a memory device.

FIG. 1 is an illustration of an example memory page 102 that is mapped to one or more memory blocks 105 of a memory device 115. One or more applications of an operating system may perform one or more memory operations with respect to the memory page 102. The operations may include writing data to the memory page 102 and reading data from the memory page 102. In some implementations, the memory device 115 may be a phase change memory ("PCM") device; however, other types of memory devices may be supported.

The memory device 115 may include a memory controller 106. The memory controller 106 may receive memory operations for the memory page 102, and may determine the memory blocks 105 that correspond to the memory page 102. The memory controller 102 may fulfill the memory operations using the determined memory blocks 105. The memory operations may include read and write operations.

In some implementations, the memory blocks 105 that correspond to the memory page 102 may be determined using a mapping of memory blocks 105 to the memory pages. The determination may be made by the memory controller 106 of the memory device 115, or alternatively by a processor of a computing device where the memory device 115 resides, or is otherwise connected to, such as a computing system 700 described with respect to FIG. 7.

Each block of the memory blocks 105 may be made up of multiple bits. These bits may be further organized into bytes. The smallest unit that may be addressed and accessed by the memory controller 106 may be a byte. In some implementations, each memory block 105 may include 64 bytes, and each memory page 102 may include 64 memory blocks. However, other sized memory blocks 105 and memory pages 102 may be used.

After some period of time, a bit of a memory block 105 may become inoperable. In some implementations, a bit is inoperable if the bit may no longer be written to or read from reliably by the memory controller 106. In addition, an inoperable bit may be a bit that cannot be fixed using conventional error-correcting pointers ("ECPs") or error-correcting codes. An example memory block 105 with an inoperable bit is illustrated in FIG. 1 as the block 107.

In some implementations, the memory controller 106 may detect that a bit in the block 107 is inoperable and may then determine that the entire block 107 is inoperable due to the single bad bit. As may be appreciated, such a determination may lead to wasted space in the memory device 115. For example, where a single inoperable bit renders an entire block 107 inoperable, up to 64 bytes may be wasted.

As will be described further with respect to FIG. 2, to reduce the amount of memory space that is wasted due to inoperable bits, memory page pointers may be used by the memory device 115 to map around the inoperable bits. A memory block with associated memory page pointers is referred to herein as a mapped memory block. In some implementations, a memory page pointer is a pointer or reference to a byte of a memory block 105 that includes an inoperable bit. The memory page pointer for a memory block 105 may be stored in a memory page pointer data structure. The memory page pointer data structure may be associated with the memory block 105 with the inoperable bit through metadata associated with the memory block 105. In some implementations, a pointer or reference to the data structure may be stored in the metadata associated with the memory block 105. Alternatively or additionally, the memory page pointer data structure may be associated with the memory block 105 by an entry in a table of memory page pointer data structures.

When a memory operation is received for the memory block 105, the memory controller 106 may check the metadata and retrieve the data structure using the pointer. The memory controller 106 may then avoid or work around the byte with the inoperable bit as identified by the memory page pointer from the data structure. In some implementations, the data structures may be stored in memory blocks 105 of the memory device 115 that are reserved or made available for the data structures.

Figure 2:
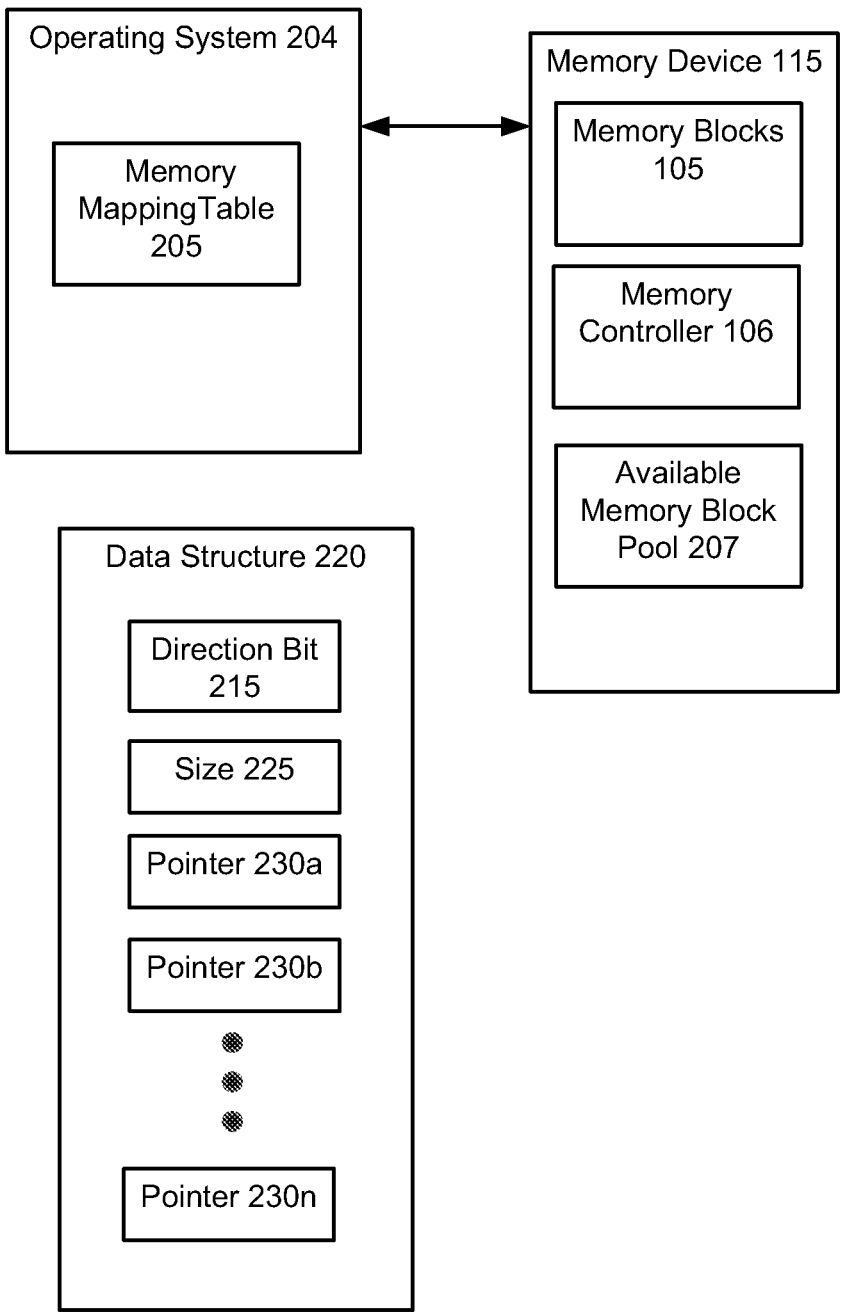
FIG. 2 is an illustration of an example environment for generating and using memory page pointers.

FIG. 2 is an illustration of an example environment 200 for generating and using memory page pointers. The environment 200 may include an operating system 204, the memory device 115, and one or more data structures 220. The operating system 204 may be executed by a computing device, such as the computing system 700 illustrated with respect to FIG. 7.

The operating system 204 may make one or more memory operation requests to the memory device 115. The memory operation requests may be made to one or more memory pages, and may include requests to write to, or read from, the memory pages. As described above, each memory page may be mapped to one or more memory blocks from the memory blocks 105.

At some point in time, a determination may be made that a memory block of the memory blocks 105 includes an inoperable bit. The determination may be made by the operating system 204 or the memory controller 106 of the memory device. In response to the determination, a data structure 220 may be generated for the memory block. As described further below, depending on the implementation, the creation and management of the data structures 220 and the mapped memory blocks may be handled by either the operation system 204 (i.e., software implementations), or the memory controller 106 (i.e., hardware implementations).

The generated data structure 220 may include one or more memory page pointers (i.e., the pointers 230a-n). Each pointer 230a-n may point to a byte of the memory block where the inoperable bit was detected. In implementations with two pointers, the pointers may define a region of the memory block that includes inoperable bits and is therefore unusable (i.e., may not be written to or read from). In implementations with a single pointer, an additional direction bit 215 may be used to define a region of the memory block that may not be written to or read from.

Figure 3:
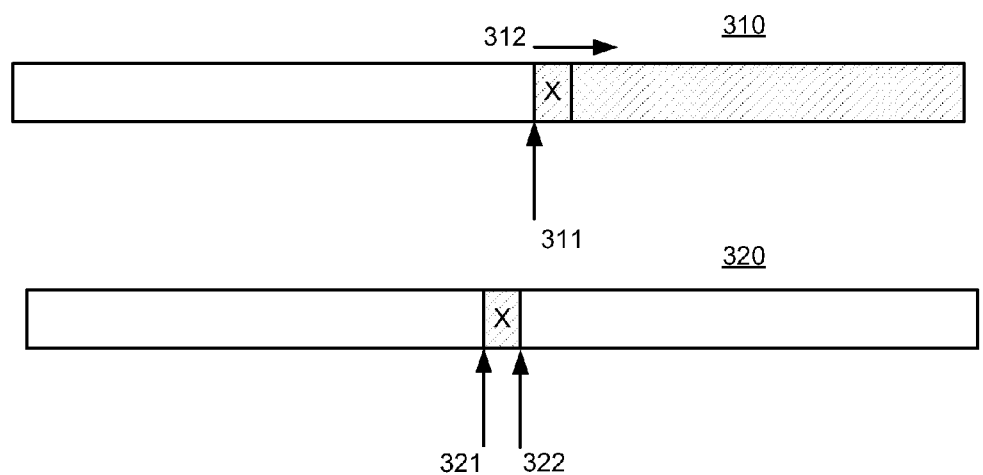
FIG. 3 is an illustration of example memory page blocks and memory page pointers.

For example, FIG. 3 illustrates two example memory blocks 310 and 320 with an 'X' in each memory block indicating a region of the memory block with one or more inoperable bits. The memory block 310 is an example mapped memory block where a corresponding data structure 220 includes a single memory page pointer 311 and a direction bit 312. The memory page pointer 311 indicates the location or address of the byte with the inoperable bit, and the direction bit 312 indicates the direction following the memory page pointer 311 in the memory block 310 where data may not be written to or read from. For example, a value of '1' for the direction bit 312 may indicate that data may not be written to or read from byte addresses that are to the left of the pointer 311 and a value for the directional bit 312 of '0' may indicate that data may not be written to or read from byte addresses that are to the right of the pointer 311. This region of unusable bytes is illustrated in FIG. 3 by the hashed lines. In some implementations, the memory controller 106 and/or operating system 204 may select the location of the memory page pointer 311 and the value of the directional bit 312 to minimize the region of unusable bytes.

In contrast, the memory block 320 illustrates an example memory block with a corresponding data structure 220 that includes two memory page pointers 321 and 322. The memory page pointer 321 indicates the beginning of the byte with the inoperable bit, and the memory page pointer 322 indicates the end of the byte with the inoperable bit. As may be appreciated, if the inoperable bits spanned several bytes, the memory page pointers 321 and 322 would define a region of unusable bytes in the memory block 320. While the use of multiple memory page pointers reduces the amount of data that is wasted in each memory block 105, it also increases the size and complexity of the data structures 220.

In some implementations, the data structures 220 may further include a size 225. The size 225 may indicate the amount of usable bytes that remain in the mapped memory block associated with the data structure 220. For example, if the mapped memory block has 62 usable bytes remaining, then the size 225 may have a value of 62. The size 225 may be used in implementations where variable sized blocks and/or pages (i.e., blocks that are smaller than a full block) are permitted by either the operating system 204 or the memory controller 106. In implementations with fixed block sizes, no size 225 field may be used.

When a data structure 220 is generated by either the memory controller 106 or the operating system 204, the data structure 220 may be stored in a memory block of the memory device 115. In some implementations, the data structure 220 may be stored on a memory block from an available memory block pool 207. The available memory block pool 207 may be a subset of the memory blocks 105 that have been reserved for data structures 220. For example, a user or administrator may reserve 5% (or any other desired or predetermined amount depending on the implementation) of the available memory blocks 105 for the available memory block pool 207.

In some implementations, the available memory block pool 207 may be created by over provisioning the memory device 115 and using the resulting memory blocks as blocks for the available memory block pool 207. In other implementations, the available memory block pool 207 may include memory blocks 105 that are mapped memory blocks themselves. For example, as memory blocks 105 that have inoperable bits are detected or otherwise become available, they may be placed into the available memory block pool 207. Alternatively or additionally, memory pages that include one or more mapped memory blocks may be placed into the available memory block pool 207.

After the data structure 220 is written to an available memory block, either the operating system 204 or the memory controller 106 may associate the data structure 220 with the memory block having the inoperable bit. In hardware based implementations, the memory controller 106 may generate a pointer to the data structure 220 and store the generated pointer in metadata associated with the mapped memory block. At a later time, if a request to perform a memory operation on the mapped memory block is received, the memory controller 106 may check the metadata and determine that the memory block has an inoperable bit and is mapped based on the pointer. The memory controller 106 may then retrieve the data structure 220 from a memory block based on the address indicated by the pointer, and may then perform the memory operation according to the memory page pointers 230a-n from the data structure 220.

In software based implementations, the operating system 204 may generate a pointer to the data structure 220 and may store the pointer in a memory mapping table 205. The memory mapping table 205 may comprise a table that includes an entry for each memory block 105 that has an associated data structure 220 that includes one or more memory page pointers 230a-n. The table 205 may be stored in memory by the operating system 204, and/or written to one or memory blocks of the memory device 115.

At a later time, if a request to perform a memory operation on the memory block is received, the operating system 204 may check the table 205 for an entry associated with the memory block and may determine that the memory block is a mapped memory block based on the entry. The operating system 204 may then retrieve the data structure 220 from a memory block based on the address indicated by the entry in the table 205, and may perform the memory operation according to the memory page pointers 230a-n from the data structure 220.

In some implementations, when the operating system 204 and/or the memory controller 106 writes a data structure 220 to a memory block, they may further create overflow space in the memory block where the data structure 220 is written that is equivalent to the space lost in the mapped memory block. For example, if a mapped memory block loses four bytes of space due to one or more inoperable bits, the operating system 204 and/or the memory controller 106 may reserve four bytes of overflow space for the mapped memory block in the memory block where the data structure 220 is written. Alternatively or additionally, the operating system 204 and/or the memory controller 106 may move any existing data from the unusable memory space to the reserved overflow space. In some implementations, the overflow space may be reserved in the front of the memory block; however, other regions of the memory block may be used.

In some implementations, when a data structure 220 is written to a memory block or when one or more inoperable bits are determined in a memory block, space in the memory block reserved for error correcting pointers may be reclaimed for storage of data structures 220 and/or overflow data 410. Depending on the implementation, up to six bits and associated error pointer bits reserved for the error correcting pointers may be reclaimed by the memory controller 106.

Figure 4:
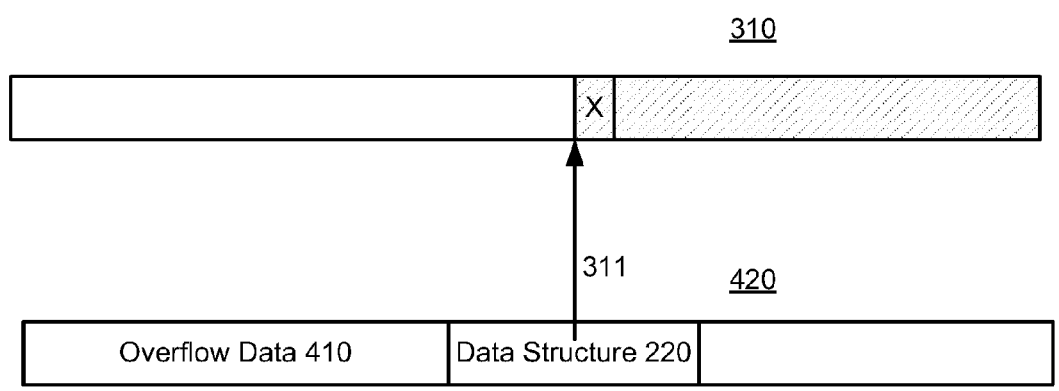
FIG. 4 is an illustration of a memory block storing a data structure and one or more bytes of overflow data.

FIG. 4 is an illustration of a memory block 420 storing a data structure 220 and one or more bytes of overflow data 410. As shown, the data structure 220 includes a memory page pointer 311 that points to the beginning of an unusable region of the memory block 310. The number of bytes of the overflow data 410 may be equivalent to the size of the unusable region of the memory block 310.

As may be appreciated, by providing overflow data for a memory block with unusable portions, the memory controller 106 and/or the operating system 204 may provide support for memory blocks of a fixed size. When the operating system 204 and/or the memory controller 106 receives a read operation for a mapped memory block, the operating system 204 and/or the memory controller 106 may retrieve the data structure 220 corresponding to the mapped memory block and use one or more memory pointers 230a-n to retrieve data from the usable blocks of the mapped memory block. The operating system 204 and/or the memory controller 106 may further combine any overflow data 410 stored with the data structure 220 with the retrieved data. The combined data may then be returned in response to the read operation.

In some implementations, multiple memory blocks 105 may be chained or linked together to provide enough overflow data for a mapped memory block. For example, where an amount of free space on the memory block 420 is not large enough for all the overflow data 410, additional space on other memory blocks may be allocated for the additional overflow data 410. For example, there may not be enough free space on the memory block 420 because of one or more inoperable bits in the memory block 310. In some implementations, to indicate that part of the overflow data 410 is stored on another memory block, a pointer to another memory block may be written to metadata associated with the memory block 420. Alternatively, or additionally, a pointer to the other memory block may be added to an entry associated with the memory block 420 in the memory mapping table 205.

In this way, multiple memory blocks may be chained together through their metadata or memory mapping table 205 entries. When a memory operation is received by the memory controller 106 and/or the operating system 204 for a mapped memory block, the chain of memory blocks may be followed by the memory controller 106 and/or operating system and used to reconstruct the data for the memory block from the overflow data of each memory block in the chain. In some implementations, the operating system 204 and/or the memory controller 106 may fill a buffer using data from each of the memory blocks in the chain, and may then fulfill the memory operation for the mapped memory block from the buffer.

Figure 5:
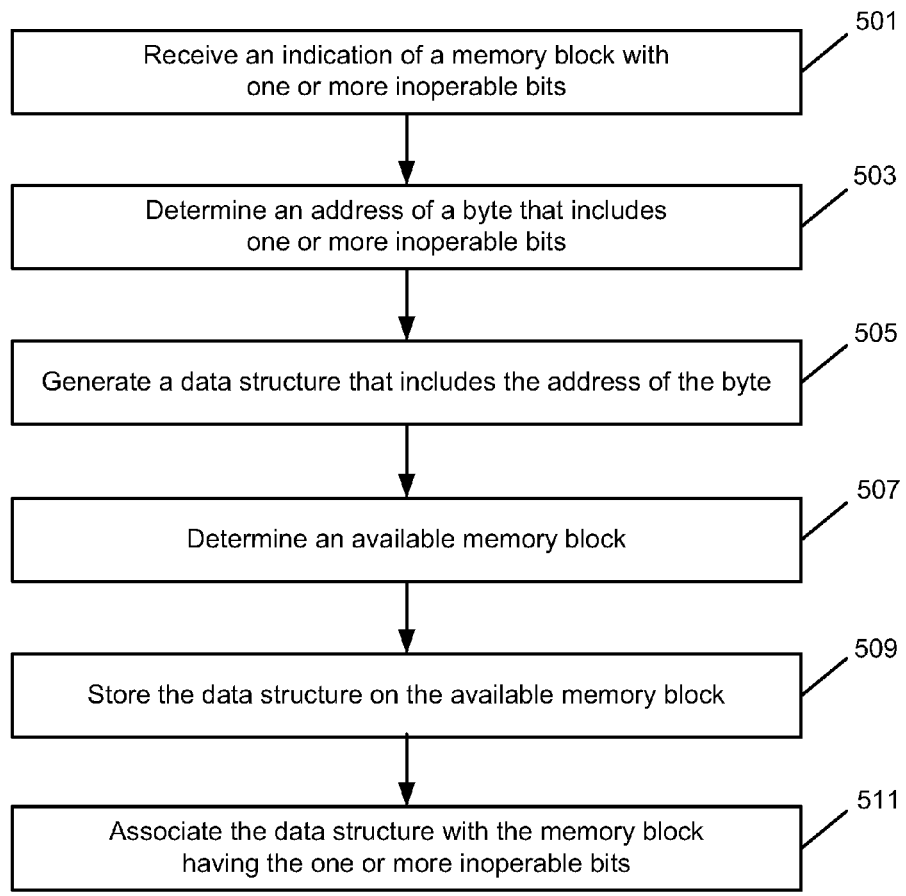
FIG. 5 is an operational flow of an implementation of a method for generating and associating one or more memory page pointers with a memory block.

FIG. 5 is an operational flow of an implementation of a method 500 for generating and associating one or more memory page pointers with a memory block. The method 500 may be implemented by a memory controller 106 and/or an operating system 204 of a computing device, for example.

An indication of a memory block with one or more inoperable bits is received at 501. The indication may be received by the memory controller 106 and/or the operating system 204. The memory block may be one of the memory blocks 105 and may be part of a memory device 115. In some implementations, the memory device may be a PCM memory device. A bit of a memory block may be inoperable if it can no longer reliably be read from or written to. In some implementations, the indication may be received as a result of an attempt to perform a memory operation at a byte of a memory block that includes the one or more inoperable bits.

An address of a byte that includes the one or more inoperable bits is determined at 503. The address of the byte may be determined by the memory controller 106 and/or the operating system 204.

A data structure that includes the address of the byte is generated at 505. The data structure 220 may be generated by the memory controller 106 and/or the operating system 204. The data structure 220 may include one or more memory page pointers 230a-n. The memory page pointers 230a-n may point to the address of the byte or a region of bytes that includes the one or more inoperable bits.

In implementations where the data structure 220 includes only one memory page pointer, the data structure 220 may further include a direction bit 215. The direction bit 215 may designate, depending on the direction, either that all the bytes that precede the pointer are unusable or that all the bytes that follow the pointer are unusable, for example. In some implementations, the memory controller 106 and/or the operating system 204 may determine the direction for the bit 215 by determining if fewer bytes precede or follow the byte with the one or more inoperable bits in the memory block, and selecting the direction with the fewest bytes.

In implementations where the data structure 220 includes two memory page pointers, the pointers may define a region of the memory block that is unusable because of the one or more inoperable bits. For example, a first pointer may define the beginning of the region, and a second pointer may define the end of the region.

In implementations where the memory blocks may have a variable size, the data structure 220 may further include an indicator of the size of the memory block (i.e., the size 225). The memory controller 106 and/or the operating system 204 may determine the size of the memory block based on the amount of remaining usable space in the memory block, and may write the determined size to the size 225 of the data structure 220.

An available memory block is determined at 507. The available memory block may be determined by the memory controller 106 and/or the operating system 204. In some implementations, the available memory block may be determined by selecting an available memory block from the available memory block pool 207. For example, the available memory block pool 207 may comprise a queue of identifiers of memory blocks from the memory blocks 105, and the memory controller 106 and/or the operating system 204 may select an identified block from the queue. The identified blocks may be memory blocks that were reserved by the memory controller 106 and/or the operating system 204, or may be memory blocks that themselves are mapped memory blocks.

The data structure is stored on the available memory block at 509. The data structure 220 may be stored on the determined available memory block by the memory controller 106 and/or the operating system 204. In some implementations, in addition to writing the data structure 220 to the available memory block, overflow data 410 may be written to the available memory block. The overflow data 410 may comprise the data that is displaced from the memory block with the one or more inoperable bits.

The data structure is associated with the memory block with the one or more inoperable bits at 511. The data structure 220 may be associated with the memory block by the memory controller 106 and/or the operating system 204. In implementations where the data structure 220 is associated with the memory block by the memory controller 106, the memory controller 106 may write a pointer to the data structure 220 to metadata associated with the memory block. In implementations where the data structure 220 is associated with the memory block by the operating system 204, the operating system 204 may associate the memory block with the data structure by adding a pointer to the data structure 220 to a memory mapping table 205 that is stored and maintained by the operating system 204.

Figure 6:
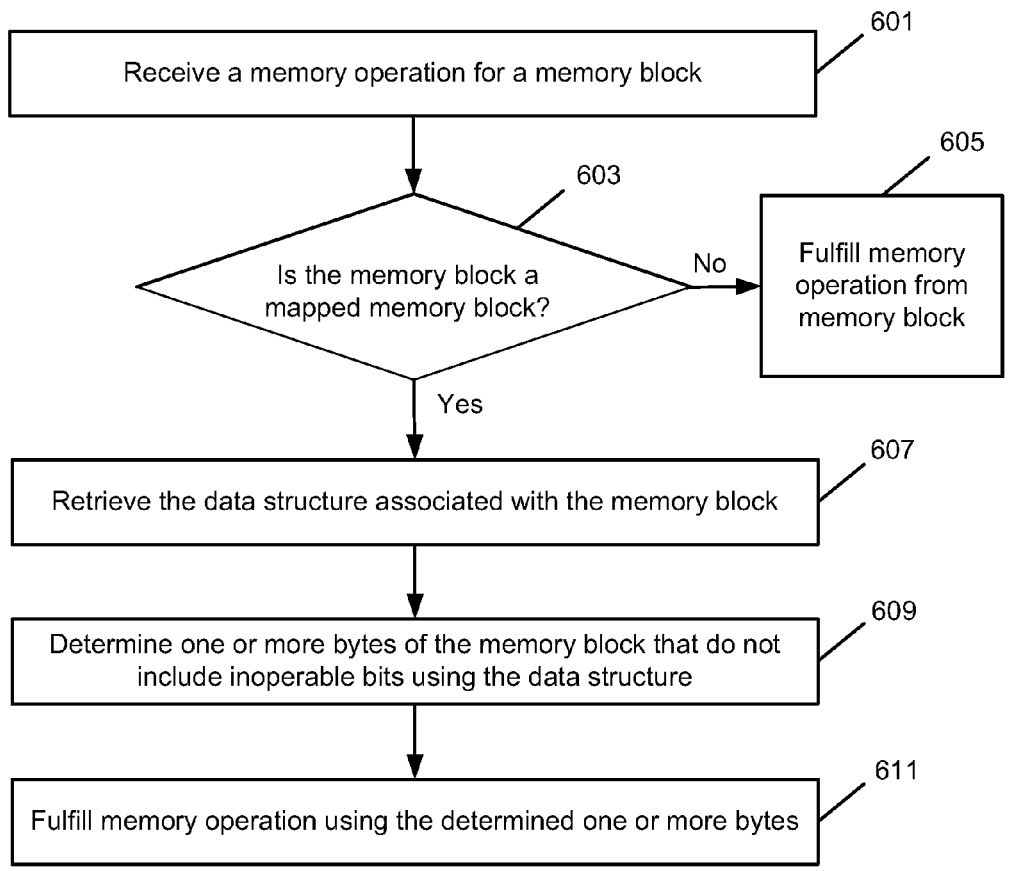
FIG. 6 is an operational flow of an implementation of a method for fulfilling a memory operation from a mapped memory block.

FIG. 6 is an operational flow of an implementation of a method 600 for fulfilling a memory operation from a mapped memory block. The method 600 may be implemented by the memory controller 106 and/or the operating system 204, for example.

A memory operation is received for a memory block at 601. The memory operation may be received by the memory controller 106 and/or the operating system 204. The memory operation may identify at least one memory block, and may include memory operations such a read or a write memory operation.

A determination is made as to whether the memory block is a mapped memory block at 603. The determination may be made by the memory controller 106 and/or the operating system 204. The memory block may be a mapped memory block if it is associated with a data structure 220. In hardware based implementations, the memory controller 106 may determine if the memory block is associated with a data structure 220 by referencing metadata associated with the memory block. In software based implementations, the operating system 204 may determine if the memory block is associated with a data structure 220 by referencing an entry in the memory mapping table 205 associated with the memory block. If the memory block is a mapped memory block, then the method 600 may continue at 605; otherwise, the method 600 may continue at 607.

At 605, the memory operation is fulfilled using the memory block. The memory operation may be fulfilled by the memory controller 106 and/or the operating system 204. The method 600 may exit after fulfilling the memory operation.

At 607, the data structure associated with the memory block is retrieved. The data structure 220 may be retrieved by the memory controller 106 and/or the operating system 204. In hardware based implementations, the data structure 220 may be retrieved by the memory controller 106 using a pointer stored in metadata associated with the memory block. In software based implementations, the data structure 220 may be retrieved by the operating system 204 using a pointer stored in an entry in the memory mapping table 205 associated with the memory block.

One or more bytes of the memory block that do not include inoperable bits are determined using the data structure at 609. The one or more bytes may be determined by the memory control 106 and/or the operating system 204 using one or more memory page pointers 230a-n. The memory page pointers 230a-n may define regions of the mapped memory block that include bytes that do not have one or more inoperable bits.

The memory operation is fulfilled using the determined one or more bytes at 611. The memory operation may be fulfilled by the memory controller 106 and/or the operating system 204. In some implementations, the memory operation may be additionally fulfilled using overflow data 410 stored on the memory block where the data structure 220 is stored.

Figure 7:
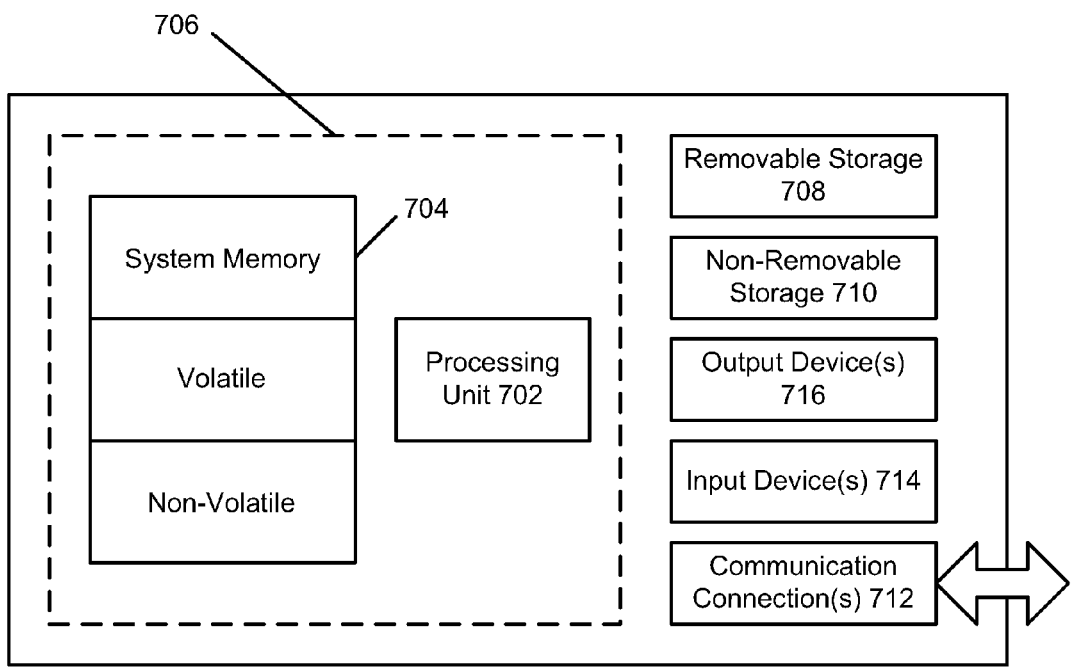
FIG. 7 shows an exemplary computing environment in which example embodiments and aspects may be implemented.

FIG. 7 shows an exemplary computing environment in which example embodiments and aspects may be implemented. The computing system environment is only one example of a suitable computing environment and is not intended to suggest any limitation as to the scope of use or functionality.

Numerous other general purpose or special purpose computing system environments or configurations may be used. Examples of well known computing systems, environments, and/or configurations that may be suitable for use include, but are not limited to, personal computers, server computers, handheld or laptop devices, multiprocessor systems, microprocessor-based systems, network PCs, minicomputers, mainframe computers, embedded systems, distributed computing environments that include any of the above systems or devices, and the like.

Computer-executable instructions, such as program modules, being executed by a computer may be used. Generally, program modules include routines, programs, objects, components, data structures, etc. that perform particular tasks or implement particular abstract data types. Distributed computing environments may be used where tasks are performed by remote processing devices that are linked through a communications network or other data transmission medium. In a distributed computing environment, program modules and other data may be located in both local and remote computer storage media including memory storage devices.

With reference to FIG. 7, an exemplary system for implementing aspects described herein includes a computing device, such as computing system 700. In its most basic configuration, computing system 700 typically includes at least one processing unit 702 and memory 704. Depending on the exact configuration and type of computing device, memory 704 may be volatile (such as random access memory (RAM)), non-volatile (such as read-only memory (ROM), flash memory, etc.), or some combination of the two. This most basic configuration is illustrated in FIG. 7 by dashed line 706.

Computing system 700 may have additional features/functionality. For example, computing system 700 may include additional storage (removable and/or non-removable) including, but not limited to, magnetic or optical disks or tape. Such additional storage is illustrated in FIG. 7 by removable storage 708 and non-removable storage 710.

Computing system 700 typically includes a variety of computer readable media. Computer readable media can be any available media that can be accessed by computing system 700 and includes both volatile and non-volatile media, removable and non-removable media.

Computer storage media include volatile and non-volatile, and removable and non-removable media implemented in any method or technology for storage of information such as computer readable instructions, data structures, program modules or other data. Memory 704, removable storage 708, and non-removable storage 710 are all examples of computer storage media. Computer storage media include, but are not limited to, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing system 700. Any such computer storage media may be part of computing system 700.

Computing system 700 may contain communication connection(s) 712 that allow the device to communicate with other devices. Computing system 700 may also have input device(s) 714 such as a keyboard, mouse, pen, voice input device, touch input device, etc. Output device(s) 716 such as a display, speakers, printer, etc. may also be included. All these devices are well known in the art and need not be discussed at length here.

It should be understood that the various techniques described herein may be implemented in connection with hardware or software or, where appropriate, with a combination of both. Thus, the methods and apparatus of the presently disclosed subject matter, or certain aspects or portions thereof, may take the form of program code (i.e., instructions) embodied in tangible media, such as floppy diskettes, CD-ROMs, hard drives, or any other machine-readable storage medium where, when the program code is loaded into and executed by a machine, such as a computer, the machine becomes an apparatus for practicing the presently disclosed subject matter.

Although exemplary implementations may refer to utilizing aspects of the presently disclosed subject matter in the context of one or more stand-alone computer systems, the subject matter is not so limited, but rather may be implemented in connection with any computing environment, such as a network or distributed computing environment. Still further, aspects of the presently disclosed subject matter may be implemented in or across a plurality of processing chips or devices, and storage may similarly be effected across a plurality of devices. Such devices might include personal computers, network servers, and handheld devices, for example.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A method comprising:
   receiving an indication of one or more inoperable bits in a memory block by a memory controller, wherein the memory block includes a plurality of bytes and each byte includes one or more bits;
   determining an address of a byte that includes the one or more inoperable bits by the memory controller;
   determining a direction bit that defines a region of unusable bytes in the memory block by the memory controller, wherein the region either precedes or follows the address of the byte that includes the one or more inoperable bits;
   generating a data structure that includes the address of the byte that includes the one or more inoperable bits and the determined direction bit by the memory controller; and
   associating the data structure with the memory block by the memory controller, wherein associating the data structure with the memory block by the memory controller comprises storing a pointer to the data structure in metadata associated with the memory block.

2. The method of claim 1, wherein the memory block is a phase change memory block.

3. The method of claim 1, wherein generating the data structure that includes the address of the byte that includes the one or more inoperable bits comprises:
   generating a first address of a byte from the memory block that precedes the byte that includes the one or more inoperable bits; and
   generating a second address of a byte from the memory block that follows the byte that includes the one or more inoperable bits.

4. The method of claim 1, wherein generating the data structure that includes the address of the byte that includes the one or more inoperable bits comprises determining a number of usable bytes in the memory block, and generating an indicator of the determined number of usable bytes.

5. The method of claim 1, wherein associating the data structure with the memory block by the memory controller comprises storing the data structure in an entry associated with the memory block in a table.

6. The method of claim 1, further comprising:
determining a spare memory block; and
storing the data structure on the spare memory block.

7. The method of claim 6, wherein determining the spare memory block comprises determining the spare memory block from a pool of spare memory blocks.

8. A method comprising:
receiving a memory operation for a memory block by a memory controller, wherein the memory block is a mapped memory block and includes a plurality of bytes and at least one byte includes an inoperable bit;
retrieving a data structure associated with the memory block by the memory controller, wherein the data structure identifies a byte from the memory block and includes a direction bit, wherein retrieving the data structure associated with the memory block comprises retrieving a pointer to the data structure from metadata associated with the memory block, and retrieving the data structure from a memory location identified by the pointer;
determining one or more bytes of the plurality of bytes that do not include an inoperable bit by the memory controller using the data structure by determining one or more bytes from the memory block that follow the identified byte in a direction indicated by the direction bit; and
fulfilling the memory operation using the determined one or more bytes by the memory controller.

9. The method of claim 8, wherein the memory location is in another memory block, and fulfilling the memory operation further comprises fulfilling the memory operation using one or more bytes from the another memory block.

10. The method of claim 9, wherein the another memory block is a mapped memory block.

11. The method of claim 8, wherein the data structure identifies a first byte from the memory block and a second byte from the memory block, and determining one or more bytes of the plurality of bytes that do not include an inoperable bit comprises determining one or more bytes from the memory block that are not between the first byte and the second byte.

12. The method of claim 8, wherein the memory block is a phase change memory block.

13. A system comprising at least one computing device;
a plurality of memory blocks;
a plurality of spare memory blocks, wherein each memory block includes a plurality of bytes and each byte includes one or more bits; and
a memory controller adapted to:
receive an indication one or more inoperable bits in a memory block of the plurality of memory blocks;
determine an address of a byte that includes the one or more inoperable bits;
determine a direction bit that defines a region of unusable bytes in the memory block, wherein the region either precedes or follows the address of the byte that includes the one or more inoperable bits;
generate a data structure that includes the address of the determined byte that includes the one or more inoperable bits and the determined direction bit;
select a spare memory block from the plurality of spare memory blocks;
store the generated data structure in the selected spare memory block; and
store a pointer to the selected spare memory block in metadata associated with the memory block with the indicated one or more inoperable bits.

14. The system of claim 13, wherein each of the plurality of memory blocks is a phase change memory block.

15. The system of claim 13, wherein the memory controller adapted to generate the data structure that includes the address of the byte that includes the one or more inoperable bits comprises the memory controller adapted to:
generate a first memory page pointer to an address of a byte from a memory block that precedes the byte that includes the one or more inoperable bits; and
generate a second memory page pointer to an address of a byte from the memory block that follows the byte that includes the one or more inoperable bits.

16. The system of claim 13, wherein the memory controller adapted to select a spare memory block from the plurality of spare memory blocks, comprises the memory controller adapted to select a spare memory block from a queue comprising identifiers of each of the plurality of spare memory blocks.

* * * * *